(12) United States Patent
Jung et al.

(10) Patent No.: US 11,239,122 B2
(45) Date of Patent: Feb. 1, 2022

(54) DISPLAY MODULE WITH IMPROVED ELECTRICAL TEST AND MANUFACTURING METHOD OF THE DISPLAY MODULE

(71) Applicant: SAMSUNG ELECTRONICS CO., LTD., Suwon-si (KR)

(72) Inventors: Youngki Jung, Suwon-si (KR); Jinho Kim, Suwon-si (KR); Sangmin Shin, Suwon-si (KR); Changjoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 65 days.

(21) Appl. No.: 16/717,307

(22) Filed: Dec. 17, 2019

(65) Prior Publication Data

US 2020/0203235 A1    Jun. 25, 2020

(30) Foreign Application Priority Data

Dec. 19, 2018  (KR) .................. 10-2018-0165563
Nov. 7, 2019   (KR) .................. 10-2019-0141754

(51) Int. Cl.
   *H01L 25/16*    (2006.01)
   *H01L 21/66*    (2006.01)
   *H01L 27/12*    (2006.01)

(52) U.S. Cl.
   CPC ............ *H01L 22/32* (2013.01); *H01L 25/167* (2013.01); *H01L 27/124* (2013.01); *H01L 27/1262* (2013.01)

(58) Field of Classification Search
   CPC . H01L 25/167; H01L 27/124; H01L 27/1262; H01L 22/32; H01L 33/62;
   (Continued)

(56) References Cited

U.S. PATENT DOCUMENTS 9,262,952 B2   2/2016  Kim et al.
9,412,772 B1   8/2016  Ghali
(Continued)

FOREIGN PATENT DOCUMENTS

JP    5433487 B2    3/2014
JP    2016-163020 A    9/2016
(Continued)

OTHER PUBLICATIONS

International Search Report (ISA/PCT/210) dated Mar. 26, 2020 from the International Searching Authority in application No. PCT/KR2019/017629.
(Continued)

*Primary Examiner* — Didarul A Mazumder
(74) *Attorney, Agent, or Firm* — Sughrue Mion, PLLC

(57) ABSTRACT

A display module including a glass substrate; a thin film transistor layer disposed in a first area of the glass substrate; a plurality of connection pads disposed in a second area extending from the first area of the glass substrate and electrically connected to the thin film transistor layer; a plurality of test pads disposed in a third area extending from the second area of the glass substrate and electrically connected to the plurality of connection pads, respectively, and a plurality of connection wirings electrically connecting the plurality of connection pads and the plurality of test pads.

13 Claims, 20 Drawing Sheets

(58) Field of Classification Search
CPC ......... H01L 27/12; H01L 27/15; H01L 25/16;
H01L 21/28; G09G 3/3266; G09G 3/006;
G09G 3/32; G02F 1/1343; G02F 1/1345
USPC ..... 257/72; 438/48, 128, 149, 151, 157, 283
See application file for complete search history.

(56) References Cited

U.S. PATENT DOCUMENTS

| | | |
|---|---|---|
| 2011/0102694 A1 | 5/2011 | Cho et al. |
| 2014/0217382 A1* | 8/2014 | Kwon ................. H01L 51/5246 257/40 |
| 2017/0179423 A1* | 6/2017 | Kwon ................. H01L 27/3276 |
| 2018/0069072 A1 | 3/2018 | Kajiyama et al. |
| 2018/0190631 A1* | 7/2018 | Kim ..................... G09G 3/3426 |

FOREIGN PATENT DOCUMENTS

| | | |
|---|---|---|
| KR | 1020060123019 A | 12/2006 |
| KR | 1020060134263 A | 12/2006 |
| KR | 10-2007-0010210 A | 1/2007 |
| KR | 1020070002901 A | 1/2007 |
| KR | 10-0713641 B1 | 5/2007 |

OTHER PUBLICATIONS

Written Opinion (PCT/ISA/237) dated Mar. 26, 2020 from the International Searching Authority in application No. PCT/KR2019/017629.

Communication dated Sep. 14, 2021 by the European Patent Office for European Patent Application No. 19898217.5.

\* cited by examiner

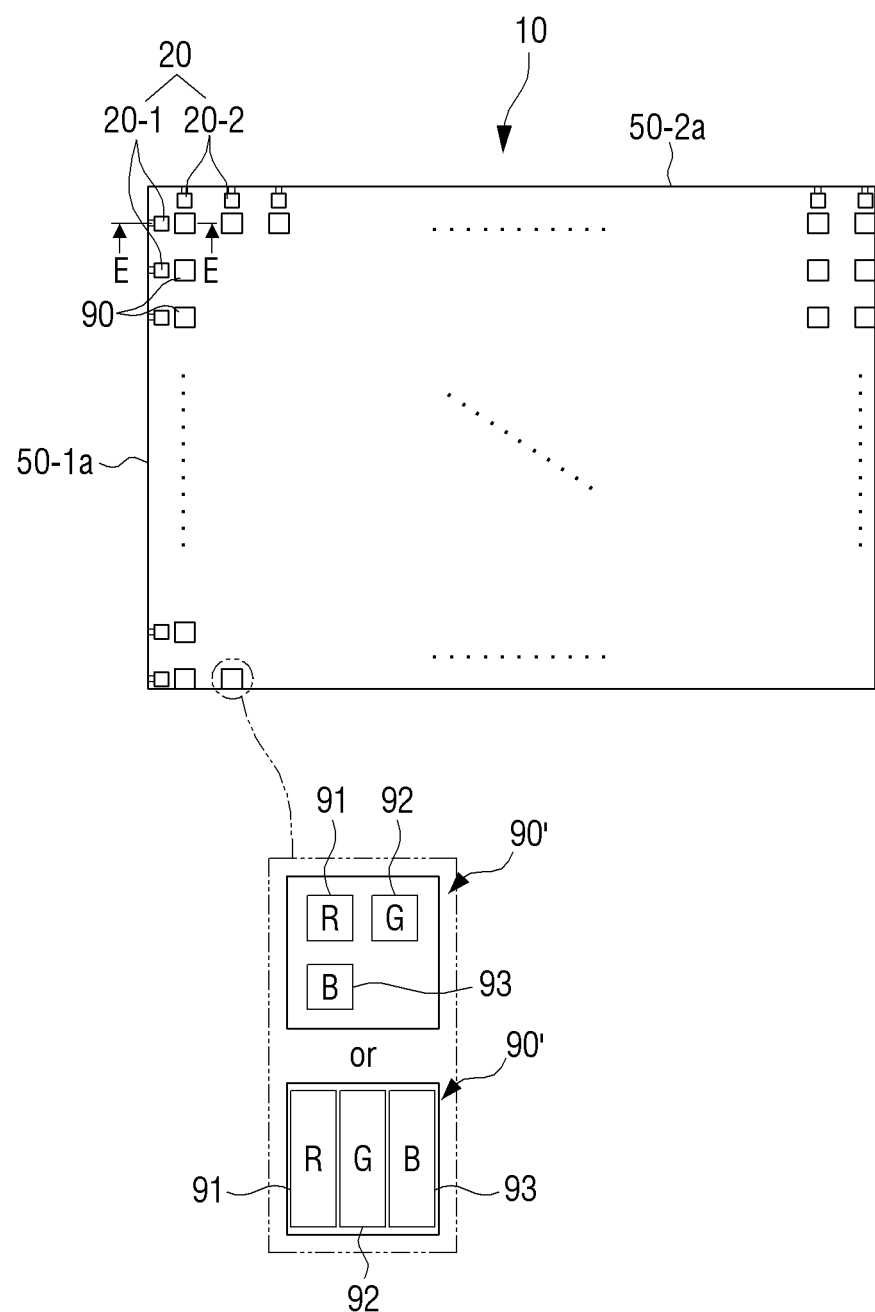

DISPLAY MODULE WITH IMPROVED ELECTRICAL TEST AND MANUFACTURING METHOD OF THE DISPLAY MODULE

CROSS-REFERENCE TO RELATED APPLICATION(S)

This application is based on and claims priority under 35 U.S.C. § 119 to Korean Patent Application No. 10-2018-0165563, filed on Dec. 19, 2018 and Korean Patent Application No. 10-2019-0141754, filed on Nov. 7, 2019, in the Korean Intellectual Property Office, the disclosure of which are incorporated by reference herein in their entireties.

BACKGROUND

1. Field

Apparatuses and methods consistent with the disclosure relate to a display module structure including a thin film transistor substrate on which a plurality of light emitting diodes (LEDs) are mounted and which may be easily tested and manufactured, in a self-luminous display device using the LEDs, and a manufacturing method thereof.

2. Description of the Related Art

A self-luminous display element that displays an image without a color filter and a backlight may use an LED inorganic self-luminous element that emits light by itself.

The LED is operated by a thin film transistor (TFT), and is disposed on a thin film transistor substrate including a plurality of thin film transistors.

The manufactured thin film transistor substrate determines whether the manufactured thin film transistor substrate is electrically operated by applying an electrical signal to a connection pad formed on the thin film transistor substrate and transmitting the electrical signal to the LED.

However, in an electrical test of the thin film transistor substrate of a display module, when the size of the LED and the size of the corresponding connection pad are reduced, it may be difficult to conduct the electrical test of the thin film transistor substrate.

SUMMARY

Provided is a display module having a thin film transistor substrate with improved electrical test convenience and manufacturing efficiency, and a manufacturing method of the display module.

According to an embodiment, there is provided a display module including: a glass substrate; a thin film transistor layer disposed in a first area of the glass substrate; a plurality of connection pads disposed in a second area extending from the first area of the glass substrate and electrically connected to the thin film transistor layer; a plurality of test pads disposed in a third area extending from the second area of the glass substrate and electrically connected to the plurality of connection pads, respectively; and a plurality of connection wirings electrically connecting the plurality of connection pads and the plurality of test pads.

The plurality of connection wirings may be disposed in the second and third areas of the glass substrate. The plurality of connection wirings may include at least one of molybdenum (Mo), titanium (Ti) and TiMo, and insulating layers may be disposed on upper and lower portions of the plurality of connection wirings, respectively.

The plurality of test pads may be removed after a substrate test is performed, and the plurality of test pads may be disposed in zigzag along the third area.

An area of each of the plurality of test pads may be greater than an area of each of the plurality of connection pads.

The plurality of test pads may be formed integrally with the plurality of connection pads corresponding to each other.

The display module may further include a plurality of low resistance wirings disposed between each of the plurality of test pads and the plurality of connection wirings.

The glass substrate may be a quadrangular shape, and the third area may include two adjacent side surface portions of the glass substrate.

The plurality of connection wirings may include a plurality of sub-connection wirings spaced apart from each other at a predetermined interval.

According to another embodiment, there is provided a display module including: a glass substrate; a thin film transistor layer formed on a first surface of the glass substrate; a plurality of light emitting diodes (LEDs) mounted on the thin film transistor layer; a plurality of connection pads formed on the first surface; a plurality of driving pads formed on a second surface of the glass substrate; a plurality of side wirings configured to electrically connect the plurality of connection pads and the plurality of driving pads corresponding to each of the plurality of connection pads; and a plurality of connection wirings configured to connect a plurality of connection pads and the plurality of test pads in a dummy area extending to an edge area of the glass substrate, where the plurality of test pads and a portion of each of the plurality of connection wirings corresponding to the plurality of test pads may be removed after a substrate test is performed.

The plurality of connection wirings may be electrically connected to the plurality of side wirings.

Each of the plurality of connection wirings may be covered with a first insulating layer on one surface and a second insulating layer on the other surface.

The plurality of connection pads may be formed integrally with the plurality of removed test pads, and one surface of each of the plurality of connection wirings may be connected to the plurality of connection pads.

Each of the plurality of connection wirings may include a plurality of sub-connection wirings spaced apart from each other at a predetermined interval.

According to another embodiment, there is provided a manufacturing method of a display module, the manufacturing method including: forming a thin film transistor substrate layer of a thin film transistor substrate on a glass substrate; forming a plurality of test pads along a dummy area in an outer portion of the glass substrate; testing whether the thin film transistor substrate operates by contacting a test needle to the plurality of test pads; removing the dummy area including the plurality of test pads; forming a plurality of side wirings along at least one side surface of the glass substrate from which the dummy area is removed; and transferring a plurality of light emitting diodes (LEDs) on the thin film transistor layer.

The forming of the plurality of test pads may further include forming a plurality of connection wirings configured to electrically connect each of a plurality of thin film transistors and each of the plurality of test pads, on the thin film transistor layer.

The forming of the plurality of test pads may further include forming a first insulating layer on an upper portion of the plurality of connection wirings and forming a second insulating layer on a lower portion of the plurality of connection wirings.

The removing the dummy area may further include simultaneously cutting a portion of the glass substrate, the plurality of connection wirings, and the first and second insulating layers by a laser.

The manufacturing method may further include, after the removing of the dummy area, polishing the removed glass substrate along a cutting surface of the glass substrate.

The manufacturing method may further include, after the removing of the dummy area, chamfering at least one corner of a cutting surface of the glass substrate.

The forming of the plurality of side wirings may further include disposing the plurality of side wirings to connect the plurality of connection pads disposed on one surface of the glass substrate and a plurality of driving pads disposed on the other surface of the glass substrate.

According to another embodiment, there is provided a display module including: a glass substrate; a thin film transistor layer disposed on the glass substrate; a plurality of connection pads connected to the thin film transistor layer; a plurality of test pads connected to the plurality of connection pads; and a plurality of connection wirings connecting the plurality connection pads and the plurality of test pads.

BRIEF DESCRIPTION OF THE DRAWINGS

The above and/or other aspects, features, and advantages of certain embodiments of the disclosure will be more apparent from the following description with reference to the accompanying drawings, in which:

FIG. 3A is a top view illustrating a dummy area that is etched in a structure of FIG. 1 according to an embodiment;

DETAILED DESCRIPTION

In order to fully understand the configuration and effects of the disclosure, embodiments of the disclosure will be described with reference to the accompanying drawings. However, the disclosure is not limited to embodiments disclosed herein, but may be implemented in various forms and may be modified in various ways. However, the description of the embodiments is provided only to make the disclosure complete, and to fully inform the scope of the disclosure to those skilled in the art. In the accompanying drawings, for convenience of description, the size of the components is illustrated to be larger than the actual size, and the ratio of each component may be exaggerated or reduced.

When one component is referred to as being "on" or "in contact with" another component, it may be understood that one component may be directly in contact with or connected to another component, but also, there may be another component therebetween. On the other hand, when one component is referred to as being "directly on" or "directly in contact with" another component, it may be understood that there may not be a third component therebetween. Other expressions describing a relationship between the components, for example, "between", "directly between", and the like should be similarly interpreted.

Terms such as "first" and "second" may be used to describe various components, but the components should not be limited by the terms. The terms may be used only for the purpose of distinguishing one component from another component. For example, without departing from the scope of the disclosure, a first component may be referred to as a second component, and similarly, the second component may also be referred to as the first component.

Singular expressions may include plural expressions unless the context clearly indicates otherwise. The term "comprises" or "having" is intended to indicate that there is a feature, number, step, operation, component, part, or combination thereof described on the specification, and that one or more other features or numbers, and it may be interpreted that steps, operations, components, parts or combinations thereof may be added.

A display module according to the disclosure may be installed and applied to a wearable device, a portable device, a handheld device, and an electronic product or an electronic device requiring various displays in a single unit, and may be applied to a display device such as a monitor for a personal computer (PC), a high resolution TV and signage (or a digital signage), an electronic display, and the like through a plurality of assembly arrangements in a matrix type.

Unless otherwise defined, terms used in the embodiments herein may be interpreted as terms commonly known to those skilled in the art.

Hereinafter, a structure of a thin film transistor substrate 1 according to an embodiment will be described with reference to FIGS. 1 and 2.

Figure 1:
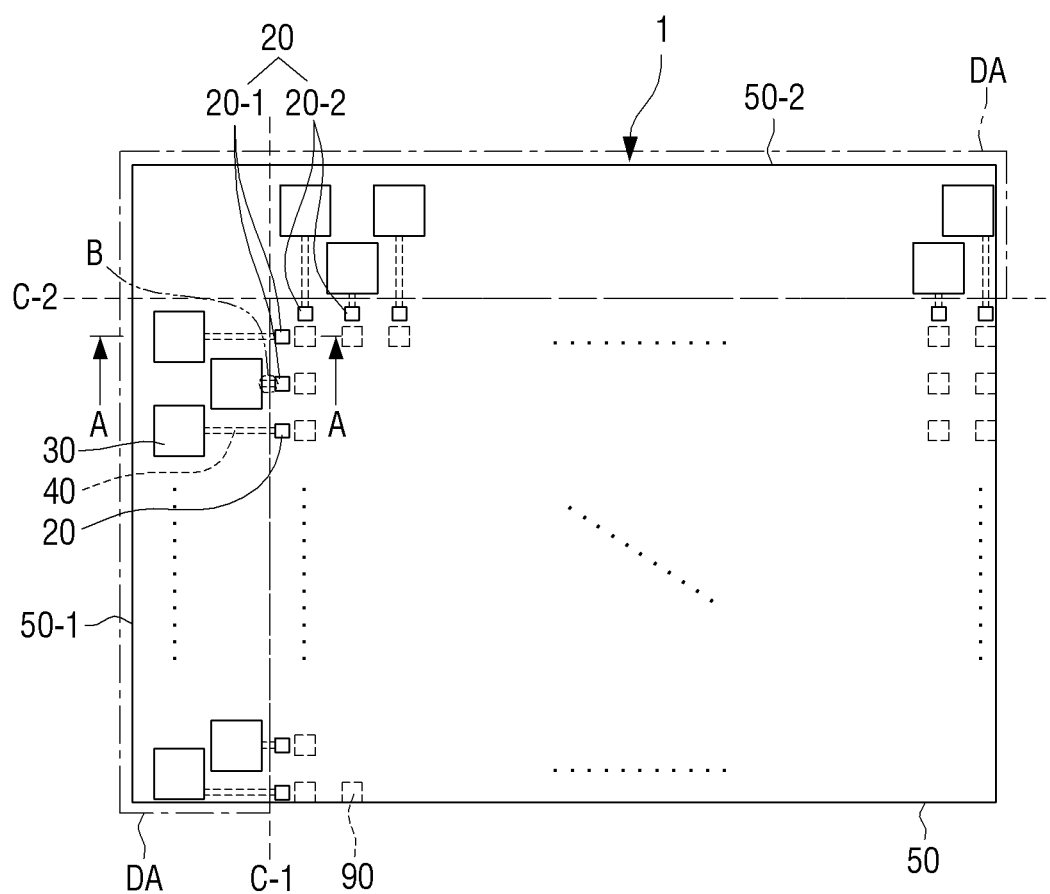
FIG. 1 is a top view illustrating a thin film transistor substrate according to an embodiment.
Figure 2:
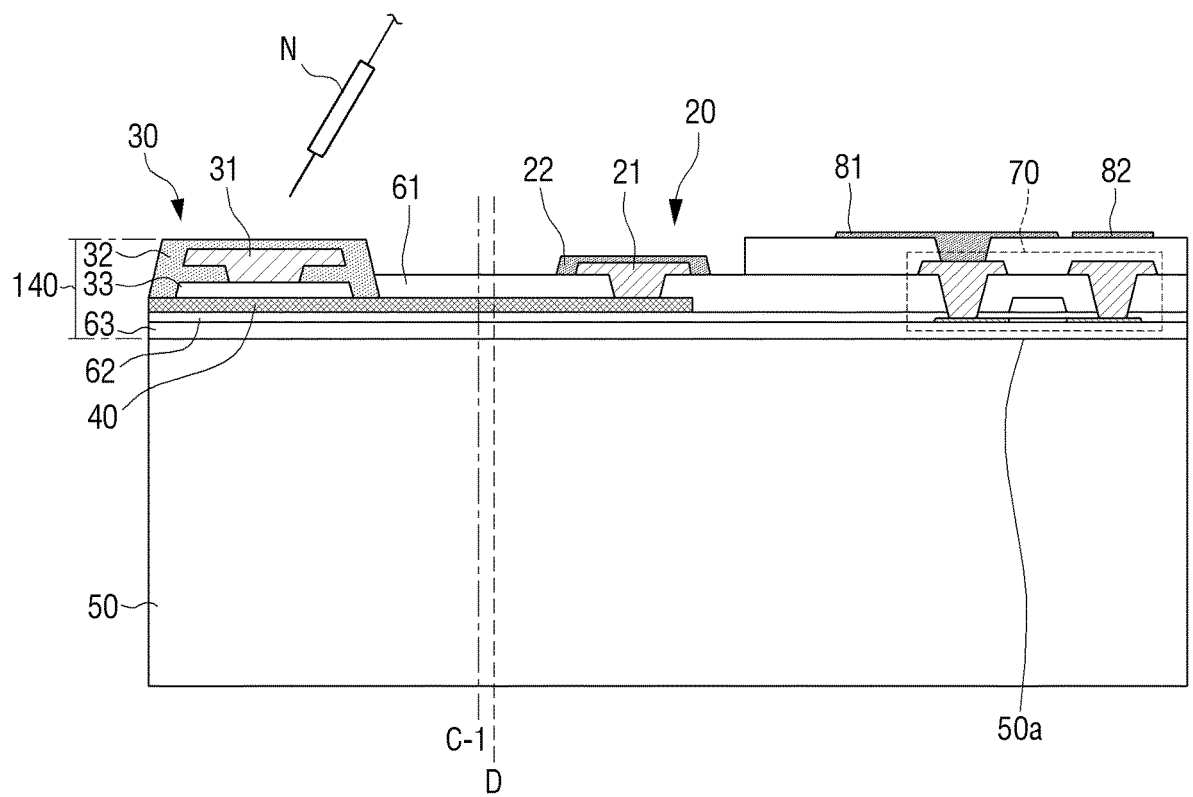
FIG. 2 is a cross-sectional view taken along line A-A of FIG. 1 according to an embodiment.

FIG. 1 is a top view illustrating a thin film transistor substrate 1 according to an embodiment and FIG. 2 is a cross-sectional view taken along line A-A of FIG. 1.

The thin film transistor substrate 1 may include a glass substrate 50, a plurality of thin film transistors 70 disposed on one surface 50a of the glass substrate 50, a plurality of connection pads 20 electrically connected to the plurality of thin film transistors 70 and disposed on one surface 50a of the glass substrate 50, a plurality of test pads 30 disposed along an edge of one surface 50a of the glass substrate 50, and a connection wiring 40 for electrically connecting each of the plurality of connection pads 20 and each of the plurality of test pads 30.

The thin film transistor substrate 1 may operate a plurality of LEDs 90 disposed on the thin film transistor substrate 1 to implement a display screen of a display device.

The thin film transistor substrate 1 may form a structure in which a thin film transistor layer 140 including the plurality of thin film transistors 70 is coupled onto the glass substrate 50.

Accordingly, a driving driver 130 (shown in FIG. 4C) for driving the thin film transistor substrate 1 may be disposed on the thin film transistor substrate 1. Further, the driving driver 130 may be implemented in the form of a chip on glass (COG) on the thin film transistor substrate 1.

The glass substrate 50 may form a base layer of the thin film transistor substrate 1, and the thin film transistor layer 140 may be formed on the glass substrate 50.

Specifically, the thin film transistor layer 140 may include the plurality of thin film transistors 70, the plurality of connection pads 20, the plurality of test pads 30, and the connection wiring 40.

The thin film transistor layer 140 may be formed by repeating a process of laminating, etching, and the like on the glass substrate 50.

The glass substrate 50 may have predetermined softness and may be formed of a material having a predetermined light transmittance.

The glass substrate 50 may have a quadrangular shape.

The thin film transistor 70 may be disposed on one surface 50a of the glass substrate 50 and may be disposed in the thin film transistor layer 140.

The thin film transistor 70 may control and drive the plurality of LEDs 90 and may be electrically connected to at least one LED 90.

Accordingly, the thin film transistor 70 may selectively drive the LED 90 by controlling a current flowing through the LED 90. That is, the thin film transistor 70 may serve as a switch for controlling a pixel, which is a basic unit of a display.

For example, the thin film transistor 70 may be electrically connected to a first electrode pad 81 and a second electrode pad 82 disposed on the thin film transistor 70.

Accordingly, the thin film transistor 70 that receives the electrical signal for driving the LED 90 from the driving driver 130 may control an operation of the LED 90 by selectively flowing a current to the LED 90 through the first electrode pad 81 and the second electrode pad 82.

Further, there may be a plurality of thin film transistors 70 disposed in a matrix form.

In addition, the thin film transistor 70 may be disposed below the LED 90. However, the position of the thin film transistor 70 is not limited thereto, but may be disposed at a position adjacent to the LED 90 to drive the LED 90.

The plurality of connection pads 20 may be electrically connected to the plurality of thin film transistors 70 and may be arranged in a form of an L-shape on the glass substrate 50. In addition, the plurality of connection pads 20 may be arranged along the edge of the glass substrate 50 or may be arranged along both edges of the glass substrate 50 facing each other.

For example, the plurality of connection pads 20 may be disposed on one side of each column and row of the plurality of LEDs 90 arranged in a matrix form.

Specifically, the plurality of connection pads 20 may include first connection pads 20-1 disposed in a vertical direction, that is, in at least one column, on the thin film transistor substrate 1, and second connection pads 20-2 disposed in a horizontal direction, that is, in at least one row, on the thin film transistor substrate 1.

The first connection pads 20-1 may be connected to a first driving driver 130-1 and may receive a control signal for sequentially controlling horizontal lines of the plurality of LEDs 90 disposed in the matrix form by one line per an image frame from the first driving driver 130-1.

The second connection pads 20-2 may be connected to a second driving driver 130-2 and may receive a control signal for sequentially controlling vertical lines of the plurality of LEDs 90 disposed in the matrix form by one line per an image frame from the second driving driver 130-2.

In addition, the connection pads 20 may not be included in the dummy area DA, but may be used as a reference for forming the dummy area DA. For example, the dummy area DA may include the plurality of test pads 30, and may include space between each of the plurality of test pads 30 and each of the plurality of connection pads 20. Accordingly, the dummy area DA may be spaced apart from the plurality of connection pads 20 by a predetermined interval, and formed along the directions in which the plurality of first connection pads 20-1 and the plurality of second connection pads 20-2 are disposed.

Further, the first connection pads 20-1 may be disposed in a vertical direction on the thin film transistor substrate 1, and the second connection pads 20-2 may be disposed in a horizontal direction on the thin film transistor substrate 1.

Further, the connection pad 20 may include a connection pad transfer part 21 electrically connected to the thin film transistor 70 and the test pad 30, and a connection pad part 22 forming a connection surface of the connection pad 20.

The connection pad transfer part 21 may be disposed in the thin film transistor layer 140, and may transmit a signal received from the connection pad part 22 to the thin film transistor 70.

The connection pad part 22 may protect the connection pad transfer part 21 from the outside and may be electrically connected to the connection pad transfer part 21 to transmit the signal received from the driving driver 130 to the connection pad transfer part 21.

The connection pad transfer part 21 and the connection pad part 22 may be formed of a conducting material, and each of them may be made of different materials. That is, the connection pad transfer part 21 may be made of one material and the connection pad part 22 may be made of another material.

For example, the connection pad 20 may have a size of about 50 µm or less in length and width, respectively.

The test pads 30 may be disposed along an edge of one surface 50a of the glass substrate 50, and may be electrically connected to the connection pads 20 through the connection wiring 40.

Here, the edge may include a side surface portion of the glass substrate 50 when the glass substrate 50 has a quadrangular shape. That is, for example, in a glass substrate 50 with a rectangular shape, the edge may include at least one of one vertical side surface 50-1 of the glass substrate 50 and one horizontal side surface 50-2 adjacent to one vertical side surface 50-1.

In addition, the test pad 30 is not limited to the pad but may be referred to as a terminal.

Accordingly, the test pad 30 may be electrically connected to the components included in the thin film transistor layer 140, such as the connection pad 20 and the thin film transistor 70. Therefore, it is possible to check whether the thin film transistor substrate 1 is electrically connected by selectively contacting an electrical needle N to the test pad 30. Further, the manufacturer may check whether the manufactured thin film transistor substrate 1 is properly operating.

The test pad 30 may include a test pad transfer part 31, a test pad part 32, and a low resistance wiring 33.

The test pad transfer part 31 may be disposed in the thin film transistor layer 140 and may be electrically connected to the connection pad 20 through the connection wiring 40. For example, the test pad transfer part 31 may be electrically connected to the connection pad transfer part 21 through the connection wiring 40 formed in the thin film transistor layer 140.

The test pad part 32 may protect the test pad transfer part 31 from the outside and may be electrically connected to the connection pad part 22 to transmit the signal received from the driving driver 130 to the connection pad transfer part 21.

The test pad transfer part 31 and the test pad part 32 may be formed of a conductor, and each of them may be made of a different material.

The low resistance wiring 33 may be disposed between each of the plurality of test pads 30 and the connection wiring 40. Further, there may be a plurality of low resistance wirings 33 configured to be disposed between each of the plurality of test pads 30 and the connection wiring 40.

For example, the low resistance wiring 33 may be disposed between the test pad transfer part 31 and the connection wiring 40.

The low resistance wiring 33 may be made of a material having a lower resistance than the test pad transfer part 31 and the test pad part 32. For example, the low resistance wiring 33 may be made of aluminum (Al), copper (Cu), or the like.

Accordingly, the low resistance wiring 33 may adjust a minimum resistance requirement value at the time of an electrical test of the thin film transistor substrate 1. Therefore, by adjusting a value of a test current flowing in the thin film transistor substrate 1 through the low resistance wiring 33, it is possible to prevent a high current flowing in the thin film transistor substrate 1 and damaging the components inside the thin film transistor substrate 1.

Further, if the minimum resistance requirement value of the thin film transistor substrate 1 is not low, the low resistance wiring 33 may not be formed.

The test pad 30 may be configured in plural, and a cross-sectional area of each of the plurality of test pads 30 may be greater than the cross-sectional area of each of the plurality of connection pads 20.

For example, the test pad 30 may have a quadrangular shape with a length and a width of about 200 μm. Accordingly, in the case of performing an electrical test of the manufactured thin film transistor substrate 1, a test needle N may more easily be in contact with the test pad 30 having a greater cross-sectional area than the connection pad 20.

Therefore, the electrical test of the manufactured thin film transistor substrate 1 may be performed more easily and the test needle N may be stably in contact with the test pad 30, thereby increasing test performance and efficiency.

In addition, even if a damage occurs to the test pad 30 during the electrical test of the manufactured thin film transistor substrate 1, the test pad 30 may be removed and replaced in a subsequent process. Therefore, it is possible to prevent a problem of unstable driving of the thin film transistor substrate 1 due to the damaged connection pad 20.

In addition, the number of the plurality of test pads 30 may correspond to the number of the plurality of connection pads 20. That is, one test pad 30 may be electrically connected to one connection pad 20.

Therefore, by testing each of the plurality of test pads 30, it is possible to test whether the components of the thin film transistor layer 140 connected to each of the plurality of connection pads 20 are properly operating.

Further, the plurality of test pads 30 may be disposed in zigzag configuration along the edge of the glass substrate 50. Accordingly, the number of the plurality of test pads 30 may correspond to the number of the plurality of connection pads 20 and a space in which the plurality of test pads 30 are disposed may be minimized.

For example, because the plurality of connection pads 20 have a minute size, thousands of connection pads may be disposed in a line at predetermined intervals. Therefore, even when the plurality of test pads 30 are disposed as few as tens to as many as thousands, the plurality of test pads 30 may be entirely disposed on the thin film transistor substrate 1 without expanding the size of the manufactured thin film transistor substrate 1.

That is, even when the dummy area DA including the area where the plurality of test pads 30 are disposed on the manufactured thin film transistor substrate 1 is removed, a portion removed on the manufactured thin film transistor substrate 1 may be minimized by minimizing the dummy area DA. Therefore, the thin film transistor substrate 1 may be easily tested through the plurality of test pads 30, and the manufacturing cost may be reduced by minimizing the area occupied by the plurality of test pads 30.

The connection wiring 40 may electrically connect the connection pad 20 and the test pad 30 and may be formed in the thin film transistor layer 140. The connection wiring 40 may be made of a material having low flexibility.

For example, the connection wiring 40 may be made of at least one of molybdenum (Mo), titanium (Ti) and TiMo. However, the connection wiring is not limited hereto. Therefore, even if the dummy area DA is removed along a first cutting line C-1 and a second cutting line C-2 included in the dummy area DA, by-products generated by the connection wiring 40 may be minimized.

Specifically, when the connection wiring 40 is made of an elastic material, many by-products may be generated along the first cutting line C-1 and the second cutting line C-2 in a cutting process. Therefore, in a subsequent process, an additional process of removing the generated by-products may be necessary.

Therefore, when the connection wiring 40 is made of an inelastic or rigid material, the process of removing the by-products may be minimized or omitted by minimizing the generation of the by-products in the cutting process, thereby reducing the manufacturing cost.

In addition, the connection wiring 40 may be formed in the form of one layer of the thin film transistor layer 140.

Further, because the connection wiring 40 connects each of the plurality of test pads 30 and each of the plurality of connection pads 20, the connection wiring 40 may be configured in plural. For example, the number of connection wirings 40 may correspond to the number of the plurality of test pads 30 and the plurality of connection pads 20.

Further, first and second insulating layers 61 and 62 may be disposed on upper and lower portions of the connection wiring 40, respectively. For example, the first insulating layer 61 may be disposed on the upper portion of the connection wiring 40, and the second insulating layer 62 may be disposed on the lower portion of the connection wiring 40.

That is, the first insulating layer 61 and the second insulating layer 62 may be formed to surround the connection wiring 40.

Therefore, when a current flows through the connection wiring 40, the current is prevented from flowing into a space other than the connection wiring 40, thereby improving stability of the electrical test of the thin film transistor substrate 1.

The first insulating layer 61 and the second insulating layer 62 may be integrally formed with a layer formed around the thin film transistor 70. That is, in the process of forming the thin film transistor layer 140 on the glass substrate 50, the first insulating layer 61 and the second insulating layer 62 may be formed.

In addition, if necessary, polycrystalline silicon (p-Si) may be disposed below each of the first insulating layer 61 and the second insulating layer 62.

Further, the first insulating layer 61 and the second insulating layer 62 may be in contact with each other at a position where the connection wiring 40 is not formed.

Further, the first insulating layer 61 and the second insulating layer 62 may be formed of an organic insulating layer or an inorganic insulating layer, and materials constituting each insulating layer may be different.

Between the glass substrate 50 and the second insulating layer 62, a buffer layer 63 may be formed to alleviate strain caused by a difference in lattice constant and coefficient of thermal expansion between the glass substrate 50 and the thin film transistor layer 140. The buffer layer 63 may be made of GaN, AlN, AlGaN, or SiNx, which are high heat resistance materials, to enable GaN layer deposition through a metal organic chemical vapor deposition (MOCVD) or molecular beam epitaxy (MBE) process.

Further, the thin film transistor substrate 1 may include a plurality of electrode pads formed on each of the plurality of thin film transistors 70 and on which the plurality of LEDs 90 are disposed.

For example, the plurality of electrode pads may include a first electrode pad 81 and a second electrode pad 82 representing different electrodes.

Figure 3B:
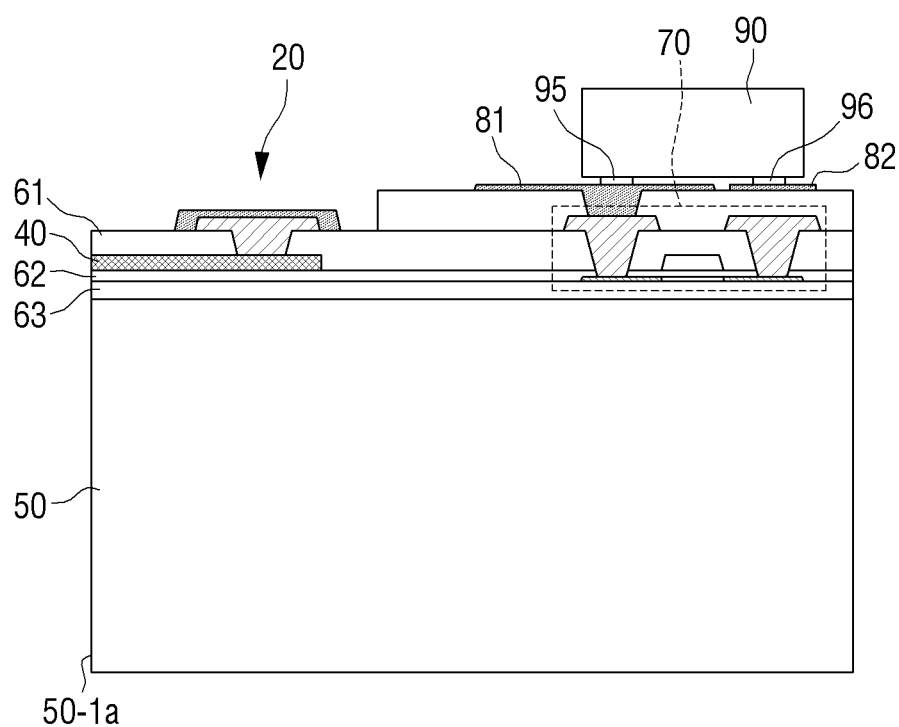
FIG. 3B is a cross-sectional view taken along line E-E of FIG. 3A according to an embodiment.

Accordingly, as illustrated in FIG. 3B, a first electrode 95 of the LED 90 may be disposed on the first electrode pad 81, and a second electrode 96 of the LED 90 may be disposed on the second electrode pad 82.

Therefore, the electrical signal transmitted from the thin film transistor 70 may be transmitted to the LED 90 through the plurality of electrode pads 81 and 82.

In addition, the plurality of thin film transistors 70 and the plurality of electrode pads 81 and 82 may be disposed in a matrix form on the glass substrate 50. Therefore, the plurality of LEDs 90 mounted on the plurality of electrode pads 81 and 82 may also be disposed in the matrix form on the glass substrate 50.

Next, a process of manufacturing the thin film transistor substrate 1 according to an embodiment will be described with reference to FIGS. 1 to 6.

Figure 3C:
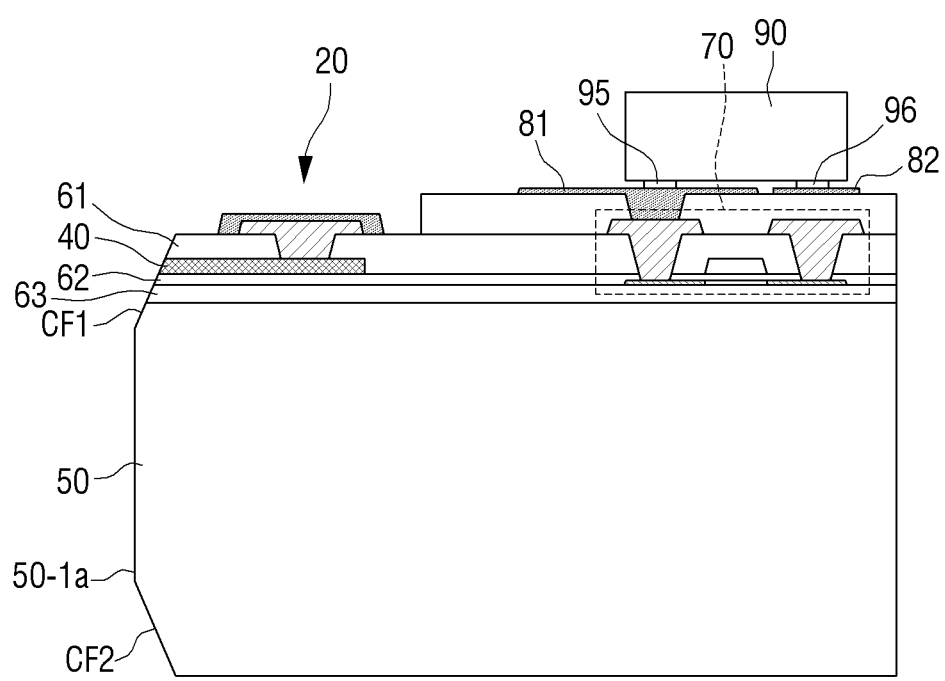
FIG. 3C is a cross-sectional view illustrating a chamfered structure of the structure shown in FIG. 3B according to an embodiment.
Figure 4A:
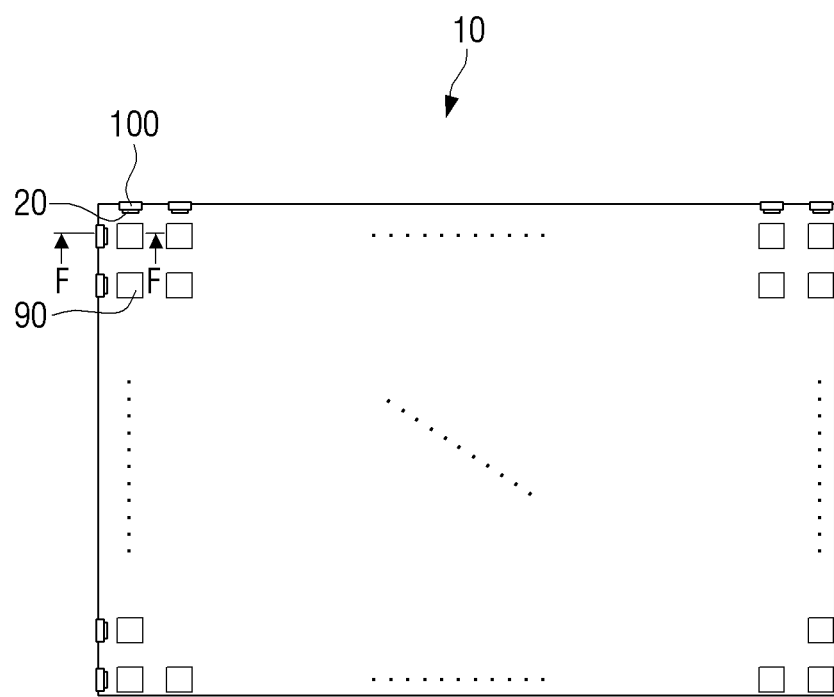
FIG. 4A is a top view illustrating a side wiring formed in a structure of FIG. 3A according to an embodiment.
Figure 4B:
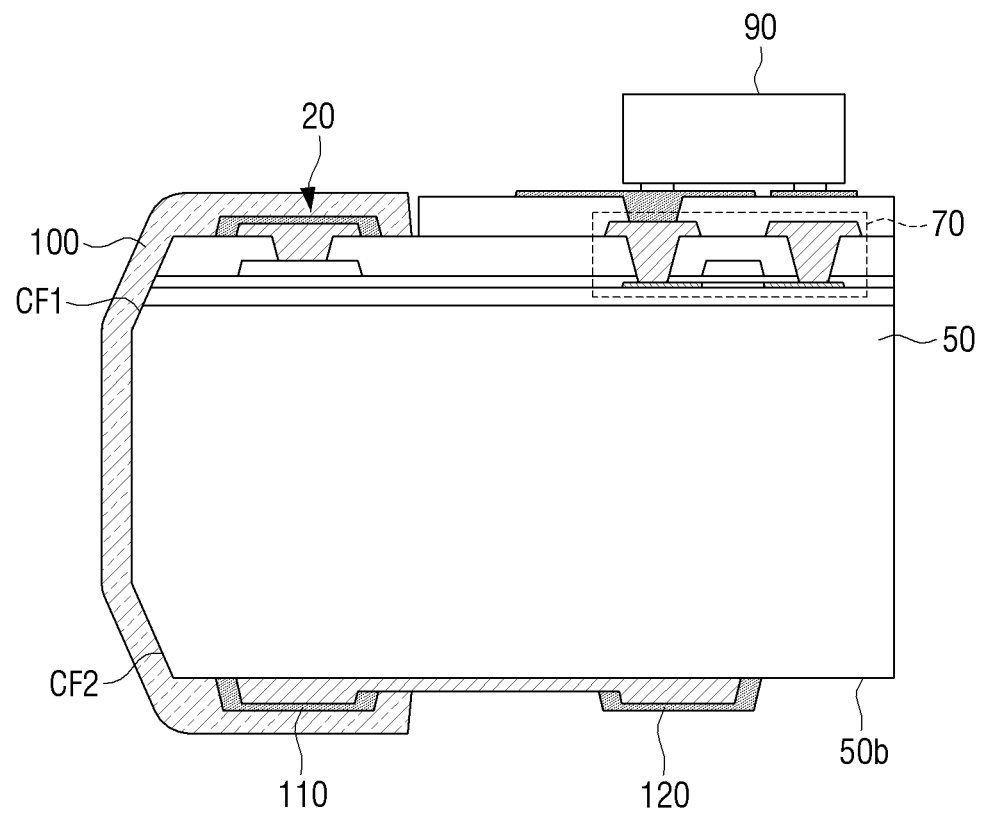
FIG. 4B is a cross-sectional view taken along line F-F of FIG. 4A according to an embodiment.
Figure 4C:
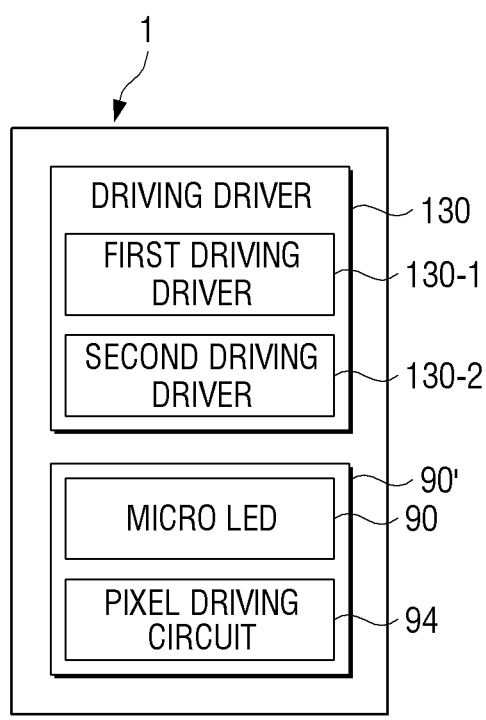
FIG. 4C is a block diagram illustrating a light emitting diode (LED) and a driving driver according to an embodiment.
Figure 5:
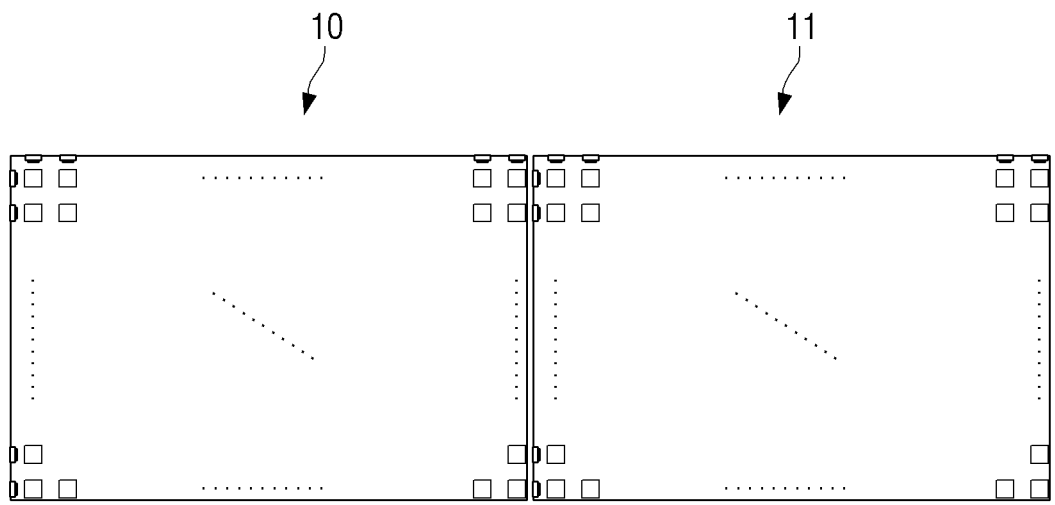
FIG. 5 is a top view illustrating an arrangement of a plurality of manufactured display modules according to an embodiment.
Figure 6:
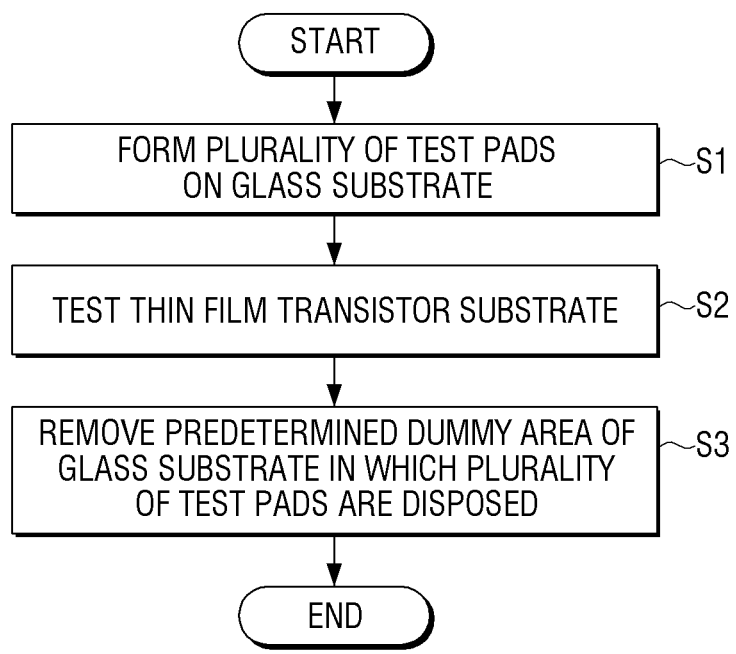
FIG. 6 is a flowchart illustrating a process of manufacturing a thin film transistor substrate according to an embodiment.

FIG. 1 is a top view illustrating the thin film transistor substrate 1 according to an embodiment, FIG. 2 is a cross-sectional view taken along line A-A of FIG. 1, FIG. 3A is a top view illustrating a dummy area DA that is removed from a structure of FIG. 1, FIG. 3B is a cross-sectional view taken along line E-E of FIG. 3A, FIG. 3C is a cross-sectional view illustrating a chamfered structure of the structure shown in FIG. 3B, FIG. 4A is a top view illustrating a side wiring 100 formed in a structure of FIG. 3A, FIG. 4B is a cross-sectional view taken along line F-F of FIG. 4A, FIG. 4C is a block diagram illustrating the LED 90 and the driving driver 130, FIG. 5 is a top view illustrating an arrangement of a plurality of manufactured display modules 10 and 11, and FIG. 6 is a flowchart illustrating a manufacturing method of the thin film transistor substrate 1 according to an embodiment.

First, as illustrated in FIGS. 1 and 2, a plurality of test pads 30 may be formed along an edge of the glass substrate 50. Specifically, a thin film transistor layer 140 may be formed on the glass substrate 50 (51).

Here, the thin film transistor layer 140 may include a plurality of connection pads 20, a plurality of test pads 30, a connection wiring 40, first and second inorganic insulating layers 61 and 62, and a plurality of electrode pads 81 and 82.

That is, in a process of forming the plurality of test pads 30, the thin film transistor layer 140 may be formed through an iterative process of stacking and etching.

For example, in the operation of forming the plurality of test pads 30, the connection wiring 40 that electrically connects each of the plurality of thin film transistors 70 and each of the plurality of test pads 30 disposed on the glass substrate 50 may be formed.

In addition, in the operation of forming the plurality of test pads 30, the insulating layers 61 and 62 may be formed on upper and lower portions of the connection wiring 40.

Next, as illustrated in FIG. 2, a test needle N may be in contact with the plurality of test pads 30 to test whether the manufactured thin film transistor substrate 1 is properly operating (S2).

Specifically, each of the plurality of test pads 30 may be electrically connected to each of the plurality of connection pads 20 through the connection wiring 40, and each of the plurality of connection pads 20 may be electrically connected to the plurality of thin film transistors 70 through electrical wiring formed in the thin film transistor layer 140.

Accordingly, in a state in which the test needle N is in contact with the plurality of test pads 30, the current allows to flow through the test needle N, thereby making possible to test whether the current may flow through the plurality of transistors 70.

Here, the number of test needles N smaller than the number of test pads 30 may be disposed to determine whether the thin film transistor substrate 1 is operated by repeatedly contacting the plurality of test pads 30, or the number of test needles N equal to or greater than the number of test pads 30 may be disposed to determine whether the thin film transistor substrate 1 is operating by simultaneously contacting the plurality of test pads 30.

In addition, the test needle N is only an example, and various configurations that may be used to perform the electrical test, such as a test pad.

Therefore, before an additional process is performed on the manufactured thin film transistor substrate 1, it is possible to check whether or not the thin film transistor substrate 1 is poorly manufactured.

Here, the additional process may mean various processes such as disposing the plurality of LEDs 90 on the thin film transistor substrate 1 or removing the dummy area DA of the thin film transistor substrate 1.

Therefore, it is possible to determine whether the additional process needs to be performed, thereby improving the manufacturing efficiency of the thin film transistor substrate 1.

In addition, the cross-sectional area of each of the plurality of test pads 30 may be greater than the size of the cross-sectional area of each of the plurality of connection pads 20. Therefore, because the test needle N does not make contact with the plurality of connection pads 20 of fine size, but instead, makes contact with the plurality of test pads 30, the test needle N may stably perform electrical tests on the plurality of test pads 30.

Accordingly, in the test process, due to the large cross-sectional area of the plurality of test pads 30, the probability that the test needle N may be in contact with the plurality of test pads 30 may increase, and the test may be stably performed. In other words, test efficiency and stability of the manufactured thin film transistor substrate 1 may be improved.

Further, in the test process, even if the plurality of test pads 30 are damaged, the plurality of test pads 30 may be removed and replaced, and thus the plurality of damaged test pads 30 may not affect the operation of the display module 10 (shown in FIG. 3A) in a state in which the plurality of LEDs 90 are disposed.

Next, after the test of the manufactured thin film transistor substrate 1 is finished, a predetermined dummy area DA of the glass substrate 50 in which the plurality of test pads 30 are disposed may be removed (S3).

Here, the operation of removing the dummy area DA may mean not only removing the glass substrate 50, but also removing a portion of the thin film transistor layer 140 formed on the glass substrate 50. For example, in the operation of removing the dummy area DA, the glass substrate 50, the insulating layers 61, 62, and the connection wiring 40 may be simultaneously removed.

The dummy area DA may be an area including the plurality of connection pads 20 on the manufactured thin film transistor substrate 1. Specifically, the dummy area DA may include an edge area of the thin film transistor substrate 1.

For example, the dummy area DA may include one vertical side surface 50-1 and one horizontal side surface 50-2 of the glass substrate 50.

In addition, the dummy area DA may include a first cutting line C-1 and a second cutting line C-2 between the plurality of connection pads 20 and the plurality of test pads 30 of the glass substrate 50. Specifically, the first cutting line C-1 may be disposed between the first connection pads 20-1 disposed in one column and the plurality of test pads 30, and the second cutting line C-2 may be disposed between the second connection pads 20-2 disposed in one row and the plurality of test pads 30.

Here, the first cutting line C-1 and the second cutting line C-2 may be perpendicular to each other. However, the intersection of the first cutting line C-1 and the second cutting line C-2 are not limited hereto.

Further, in the operation of removing the dummy area DA, the glass substrate 50 may be removed such that the plurality of connection pads 20 electrically connected to the plurality of thin film transistors 70 and disposed on one surface of the glass substrate 50 are positioned at edges of the etched glass substrate 50.

That is, as illustrated in FIG. 3A, after the dummy area DA is removed, the glass substrate 50 and the thin film transistor substrate 1 may have a first cutting surface 50-1a in a vertical direction and a second cutting surface 50-2a in a horizontal direction adjacent to the first cutting surface 50-1a.

For example, the first cutting surface 50-1a may be parallel to the first connection pads 20-1 disposed in a column, and the second cutting surface 50-2a may be parallel to the second connection pads 20-2 disposed in a row.

Further, in the operation of removing the dummy area DA, the glass substrate 50 may be removed through a laser emitted from a laser cutter. However, the means for removing the glass substrate 50 is not limited to the laser, and the glass substrate 50 may also be removed by various mechanical apparatuses such as a grinder.

In addition, as illustrated in FIGS. 2 and 3A, after the etching is performed along the first cutting line C-1 and the second cutting line C-2, the first and second cutting surfaces 50-1a and 50-2a of the glass substrate 50 may be polished along a polishing line D.

Accordingly, after the cutting process, by-products generated in the glass substrate 50 and the thin film transistor layer 140 may be removed by polishing the first and second cutting surfaces 50-1a and 50-2a of the glass substrate 50.

In addition, a side wiring 100 formed on the first and second cutting surfaces 50-1a and 50-2a may be stably formed without being lifted or disconnected by smoothing the first and second cutting surfaces 50-1a and 50-2a of the glass substrate 50. Accordingly, when the manufactured display modules 10 and 20 operate, electrical signals transmitted from the driving driver 130 disposed at the rear surface of the display modules 10 and 20 may be stably transmitted to the plurality of LEDs 90 through the side wiring 100.

In addition, as illustrated in FIG. 3C, after the cutting process is performed along the first and second cutting lines C-1 and C-2, corners of the first and second cutting surfaces 50-1a and 50-2a of the glass substrate 50 may be chamfered.

That is, one surface of at least one of the thin film transistor layer 140 and the glass substrate 50 may be chamfered to form a chamfered surface CF. Specifically, the chamfered surfaces CF may be formed on the first and second cutting surfaces 50-1a and 50-2a of the glass substrate 50.

Accordingly, the shortest distance of the side wiring 100 connecting the plurality of connection pads 20 disposed on one surface of the glass substrate 50 and a plurality of driving pads 110 disposed on the other surface of the glass substrate 50 may be reduced, thereby reducing loss in current and signal. In addition, it is possible to structurally prevent the side wiring 100 from being disconnected by sharp corners of the first and second cutting surfaces 50-1a and 50-2a.

Further, the plurality of LEDs 90 may be disposed on the plurality of electrode pads 81 and 82 formed on the plurality of thin film transistors 70.

However, the operation of disposing the plurality of LEDs 90 may be performed after the operation of testing the manufactured thin film transistor substrate 1.

Here, the LED 90 may be made of an inorganic light emitting material having a size of about 100 μm or less in width, length, and height, and may be a micro LED that is disposed on the thin film transistor substrate 1 and emits light by itself.

Referring to FIGS. 3A and 4C, the LED 90 may be configured by a single pixel 90', and one pixel may include a red LED 91 emitting red light, a green LED 92 emitting green light, and a blue LED 93 emitting blue light, which are sub-pixels, and a pixel driving circuit 94 for driving the plurality of sub-pixels.

That is, one pixel 90' may include the red LED 91 emitting red light, the green LED 92 emitting green light, the blue LED 93 emitting blue light, and the pixel driving circuit 94 for driving the plurality sub-pixels.

The sub-pixels 91, 92, and 93 may be arranged in a matrix form or sequentially arranged in one pixel 90'. However, the form of the arrangement of the sub-pixels 91, 92, and 93 is only an example, and the sub-pixels 91, 92, and 93 may be disposed in various forms within each single pixel 90'.

The LED 90 may have fast response speed, low power consumption, and high luminance, and thus has been in the spotlight as a light emitting device of next generation display. Specifically, the LED 90 may have a higher efficiency of converting electricity into photons than those of conventional LCDs.

In other words, the LED 90 has a higher "brightness per watt" compared to conventional LCD displays. As a result, the LED 90 may emit the same brightness with about half of the energy required for the conventional LCDs.

Furthermore, the LED 90 may implement high resolution, excellent color, contrast, and brightness, thereby accurately expressing a wide range of colors, and implementing a clear screen even in bright sunlight. In addition, because the LED 90 generates less heat, a long service life is ensured without deformation.

In addition, the LED 90 may be a flip chip.

Next, as illustrated in FIGS. 4A and 4B, a plurality of driving pads 110 and a plurality of link pads 120 connected to the plurality of driving pads 110 may be formed on the other surface 50b of the etched glass substrate 50.

The plurality of driving pads 110 may be disposed at positions facing the positions where the plurality of connection pads 20 are formed.

Further, the plurality of link pads 120 may be disposed to be adjacent to the plurality of driving pads 110, and may be electrically connected to the driving driver 130.

After the plurality of driving pads 110 and the plurality of link pads 120 are formed, a side wiring 100 may be formed along the first and second cutting surfaces 50-1a and 50-2a of the glass substrate 50 to connect the plurality of connection pads 20 disposed on one surface 50a of the glass substrate 50 and the plurality of driving pads 110 disposed on the other surface 50b of the glass substrate 50.

Accordingly, the manufactured thin film transistor substrate 1 may operate as the first display module 10 capable of implementing one display screen after undergoing various processes.

Specifically, signal information of the display screen may be generated from the driving driver 130 disposed on the other surface 50b of the first display module 10, and the signal information may be transmitted to the LED 90 through the link pads 120, the driving pads 110, the side wiring 100, the connection pads 20, and the thin film transistor 70 which are connected to the driving driver 130.

Accordingly, the LED 90 receiving the signal information of the display screen being operated, the first display module 10 may implement the display screen.

Further, as illustrated in FIG. 5, the second display module 11 having the same manufacturing structure as the first display module 10 may be disposed in parallel to the first display module 10 to implement one display screen.

That is, the plurality of display modules 10 and 11 may be arranged in accordance with the size of the display to be implemented by each of the display modules 10 and 11 manufactured in a module form to form one display screen.

For example, when the first and second display modules 10 and 11 are disposed in parallel to each other in the horizontal direction, the display screen may be implemented to have a longer length in the horizontal direction than that in the vertical direction.

Alternatively, when the first and second display modules 10 and 11 are disposed in parallel to each other in the vertical direction, the display screen may be implemented to have a longer length in the vertical direction than that in the horizontal direction.

Therefore, the display screens of various sizes and shapes may be implemented according to the number and shape of the plurality of arranged display modules.

Hereinafter, a structure of the connection wiring 40 according to an embodiment will be described with reference to FIG. 7A.

Figure 7A:
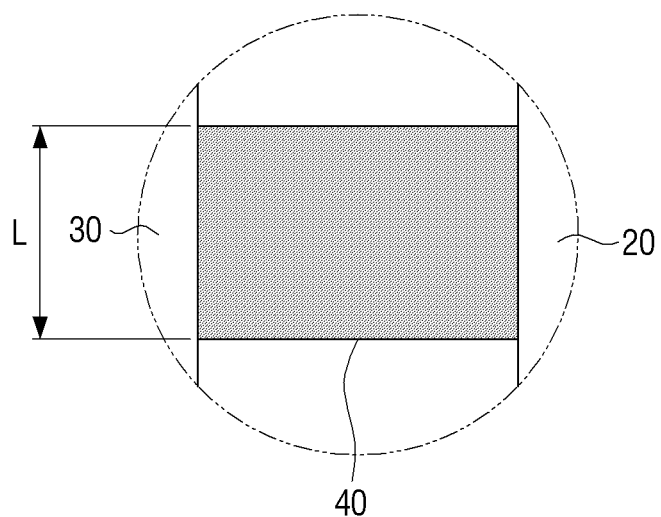
FIG. 7A is an enlarged view illustrating part B of FIG. 1 according to an embodiment.

FIG. 7A is a top view illustrating the connection wiring 40 according to an embodiment.

As illustrated in FIG. 7A, the connection wiring 40 may electrically connect one test pad 30 and one connection pad 20. In this case, the connection wire 40 may be formed to have a predetermined length with respect to the test pad 30 and the connection pad 20.

Hereinafter, a structure of a connection wiring 40' according to a modified example will be described with reference to FIG. 7B.

Figure 7B:
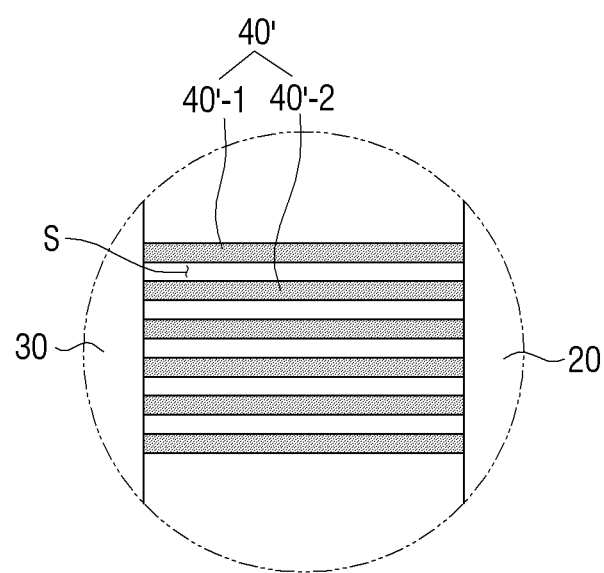
FIG. 7B is a top view illustrating another example of a connection wiring according to an embodiment.

FIG. 7B is a top view illustrating the connection wiring 40' according to another embodiment.

As illustrated in FIG. 7B, each of the connection wirings 40' may include a plurality of sub-connection wirings 40'-1 and 40'-2 spaced apart from each other by a predetermined interval.

For example, the plurality of sub-connection wirings 40'-1 and 40'-2 may be disposed to have a separation space S disposed between the sub-connection wiring 40'-1 and 40'-2, and the number of the plurality of sub-connection wirings may vary.

Accordingly, because the plurality of sub-connection wirings 40'-1 and 40'-2 are disposed to have the separation space S spaced apart from each other, by-products generated in the connection wrings 40' may be reduced according to the separation space S when cutting is performed between the connection pad 20 and the test pad 30.

Therefore, when the connection wiring 40' is made of an inelastic or sturdy material, the process of removing the by-products may be minimized or omitted by minimizing the generation of the by-products in the cutting process, thereby reducing the manufacturing cost.

Further, by preventing the inclusion of the by-products in the side wiring 100 when the side wiring 100 is connected to the connection pad 20, it is possible to implement stable signal transmission in the display modules 10 and 11.

Hereinafter, a structure of a connection wiring 40" according to another embodiment will be described with reference to FIG. 7C.

Figure 7C:
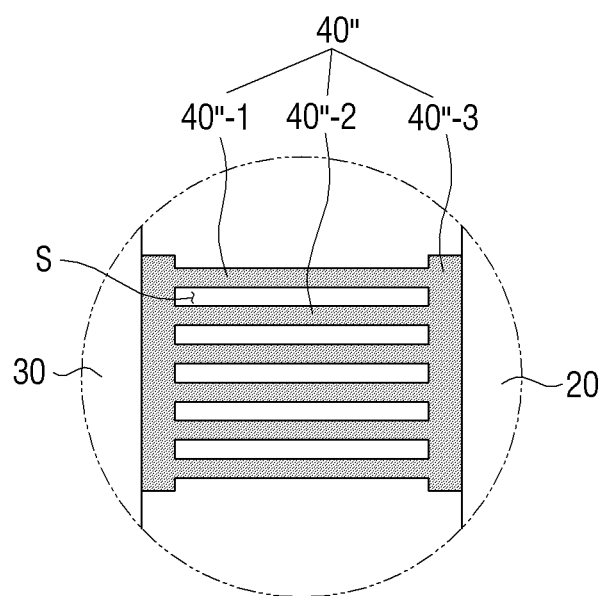
FIG. 7C is a top view illustrating still another example of a connection wiring according to an embodiment.

FIG. 7C is a top view illustrating a connection wiring 40" according to another embodiment.

As illustrated in FIG. 7C, each of the connection wirings 40" may include a plurality of sub-connection wirings 40"-1 and 40"-2 spaced apart from each other by a predetermined interval, and connection portions 40"-3 formed to be adjacent to each of the plurality of connection pads 20 and each of the plurality of test pads 30.

Specifically, the connection portions 40"-3 may be formed at one end and the other end of the plurality of sub-connection wirings 40"-1 and 40"-2, respectively, and may increase a cross-sectional area of the connection wiring 40".

By adjusting resistance based on the cross-sectional area of the connection wiring 40", a current value between the connection pad 20 and the test pad 30 may be adjusted, and by-products generated in the connection wring 40" may be reduced according to the separation space S when cutting is performed between the connection pad 20 and the test pad 30.

Figure 8:
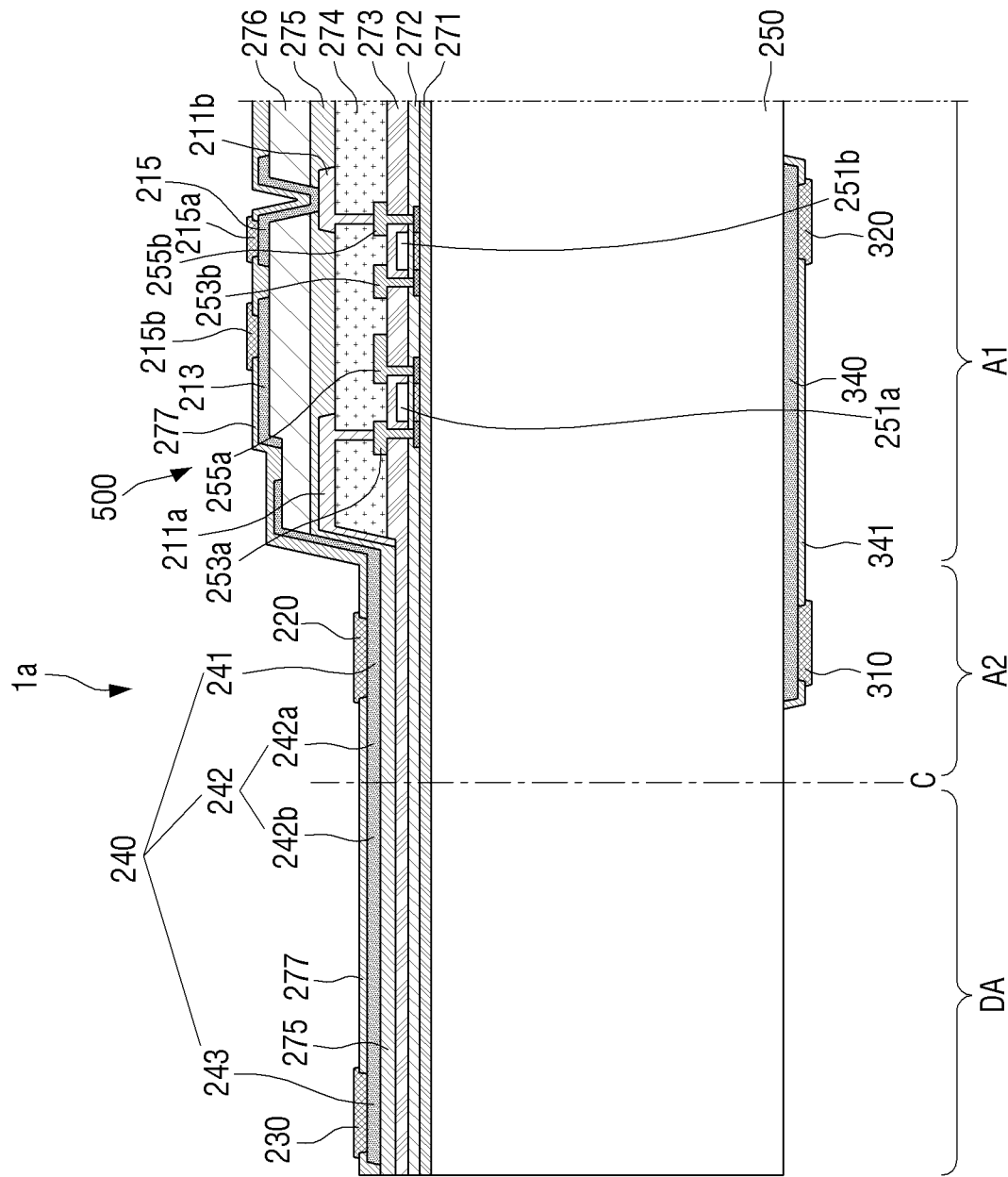
FIG. 8 is a cross-sectional view illustrating a thin film transistor substrate according to another embodiment.
Figure 9:
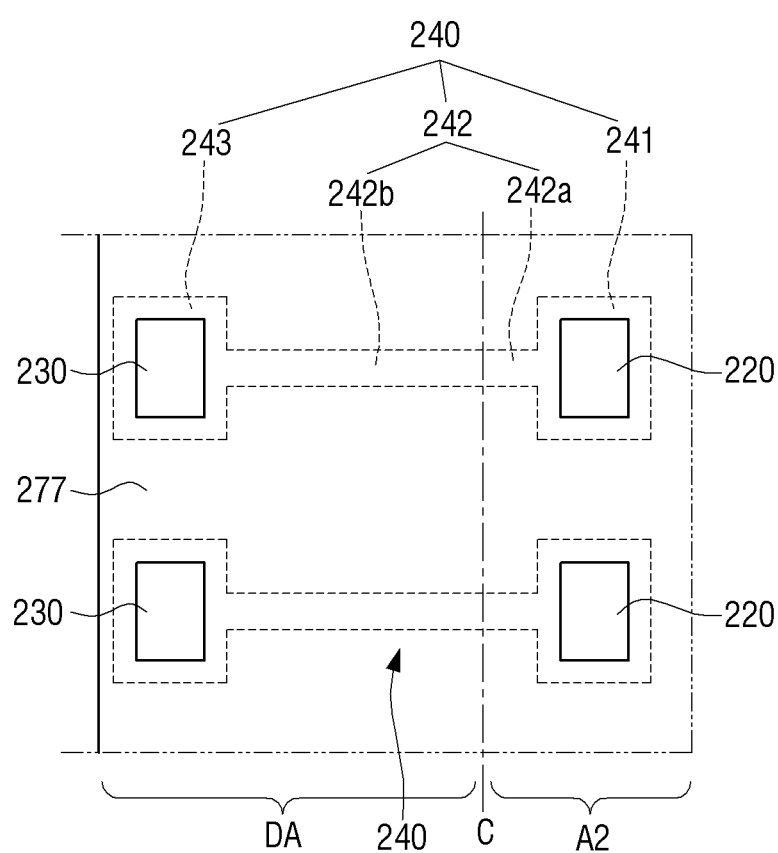
FIG. 9 is a plan view illustrating a second area A2 and a dummy area DA illustrated in FIG. 8 according to an embodiment.

FIG. 8 is a cross-sectional view illustrating a thin film transistor substrate according to another embodiment and FIG. 9 is a plan view illustrating a second area A2 and a dummy area DA illustrated in FIG. 8.

Referring to FIGS. 8 and 9, a thin film transistor substrate 1a according to another embodiment may have a dummy area DA in which a plurality of test pads are disposed similarly to the thin film transistor substrate 1 described above. In this case, the dummy area DA may be removed when the test of the thin film transistor substrate 1a is completed.

The thin film transistor substrate 1a according to another embodiment may have substantially the same structure as the structure of the thin film transistor substrate 1 described above, but may be different in some configurations.

Hereinafter, a structure of the thin film transistor substrate 1a according to another embodiment will be described.

The thin film transistor substrate 1a according to another embodiment may include a glass substrate 250, a thin film transistor layer 500 formed in a first area A1 of the glass substrate 250, a plurality of connection pads 220 disposed in a second area A2 of the glass substrate 250, and a plurality of test pads 230 disposed in a dummy area DA of the glass substrate 250.

A buffer layer 271 that is in contact with a bottom surface of the thin film transistor layer 500 may be disposed on an upper surface of the glass substrate 250. The buffer layer 271 may alleviate strain caused by a difference in lattice constant and coefficient of thermal expansion between the glass substrate 250 and the thin film transistor layer 500.

Figure 11:
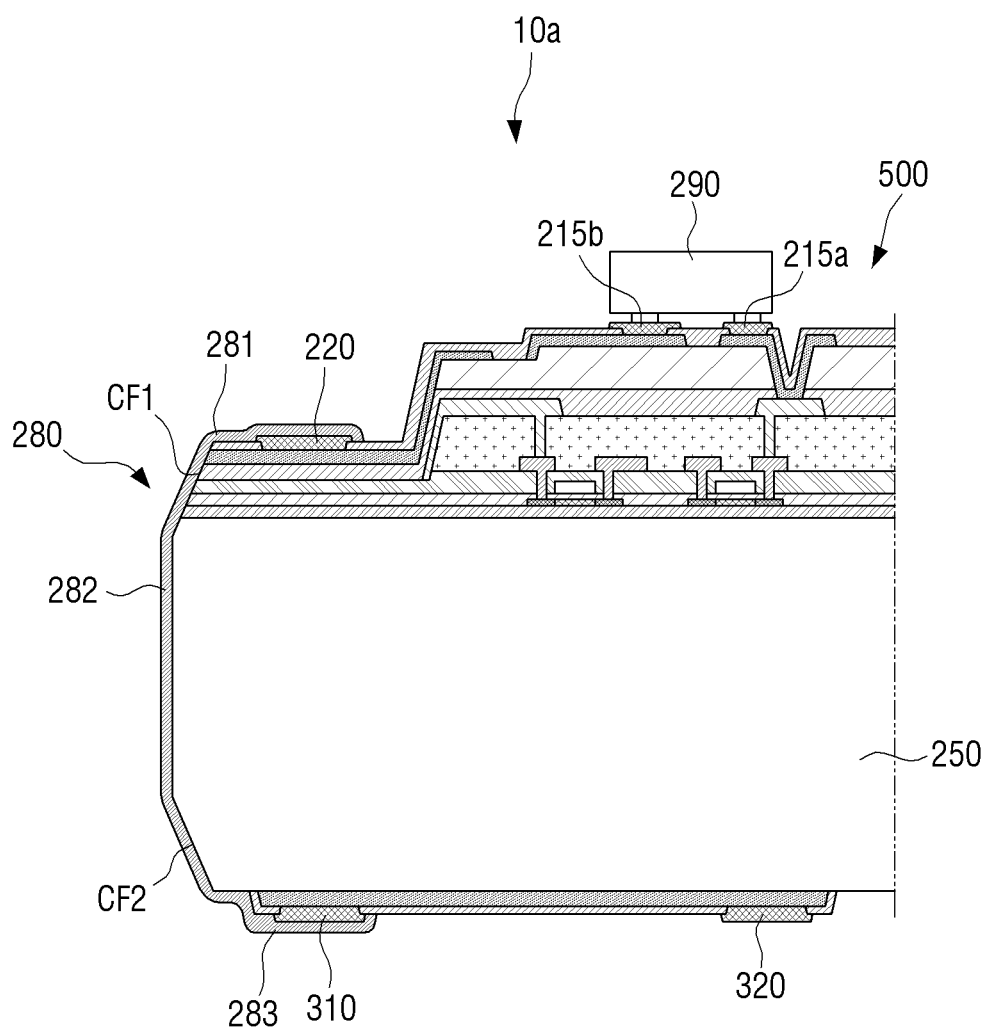
FIG. 11 is a cross-sectional view illustrating a display module according to another embodiment.

The dummy area DA of the glass substrate 250 may be defined as an area to be removed during a cutting process in a process of manufacturing a display module 10a (as shown in FIG. 11) as the outermost portion of the glass substrate 250. In this case, the dummy area DA may be an area including at least one of four sides when the glass substrate 250 has a quadrangular shape. The dummy area DA and the second area A2 may also be divided with a cutting line C as a boundary.

The first area A1 of the glass substrate 250 may be defined as an area occupied by the thin film transistor layer 500, and the second area A2 may be defined as an edge area of the glass substrate 250 in a state in which the dummy area DA is removed by the cutting process. That is, the second area A2 may correspond to the outermost portion of the glass substrate 250 when the dummy area DA is removed.

The thin film transistor layer 500 may include gate wirings 251a and 251b, data wirings 253a, 253b, 255a, and 255b, Vdd power wirings 211a and 211b connected to some 253a and 255b of the data wirings, Vss power wirings 213 and 215, and pixel electrodes 215a and 215b.

In this case, a plurality of thin film transistor layers 500 may include a gate insulating layer 272 and first to fifth insulating layers 273, 274, 275, 276, and 277 sequentially stacked upward from an upper surface of the buffer layer 271. The first to fifth insulating layers 273, 274, 275, 276 and 277 may be made of an inorganic or organic insulating material. For example, the first, third and fifth insulating layers 273, 275, and 277 may be made of an inorganic insulating material, and the second and fourth insulating layers 274 and 276 may be made of an organic insulating material.

The first, second, fourth, and fifth insulating layers 273, 274, 276, and 277 may be formed up to the dummy area DA. In particular, a connection wiring 240 that electrically connects the plurality of connection pads 220 and the plurality of test pads 230 may be disposed between the fourth and fifth insulating layers 276 and 277 in the first area A1. Accordingly, upper and lower portions of the connection wiring 240 may be covered with the fourth and fifth insulating layers 276 and 277.

The plurality of connection pads 220 disposed in the second area A2 of the glass substrate 250 and the plurality of test pads 230 disposed in the dummy area DA may be electrically connected to each other through the connection wiring 240. The connection wiring 240 may be a wiring extending from the Vss power wiring 213.

Referring to FIG. 9, the connection wiring 240 may be formed to be disposed across the second area A2 and the dummy area DA. Accordingly, when the cutting is performed along the cutting line C, a portion 242a of the connection wiring 240 may be exposed on a cutting surface of the thin film transistor substrate 1a in a state in which the dummy area DA is removed.

The connection wiring 240 may include a first connection part 241 to which the connection pad 220 is electrically connected to the upper surface thereof, a second connection part 243 to which the test pad 230 is electrically connected to the upper surface thereof, and a bridge part 242 connecting the first and second connection parts 241 and 243 to each other. A portion 242a of the bridge part 242 may be disposed in the second area A2 and the remaining portion 242b may be positioned in the dummy area DA.

In this case, a width of the bridge part 242 may be thinner than the width of the first and second connection parts 241 and 243. However, the width of the bridge part 242 is not limited thereto and may be formed to be the same as that of the first and second connection parts 241 and 243.

In addition, the thin film transistor layer 500 may be formed by a low temperature poly silicon (LTPS) TFT process or an oxide TFT process, and according to each process, at least some of the gate wirings 251a and 251b, the data wirings 253a, 253b, 255a and 255b, the Vdd power wirings 211a and 211b, the Vss power wirings 213 and 215, and the connection wiring 240 may be made of a low resistance metal material.

For example, in the case of the thin film transistor layer 500 formed by the LTPS TFT process, the gate wirings 251a and 251b may be made of molybdenum (Mo) having high heat resistance, and the data wirings 253a, 253b, 255a, and 255b, the Vdd power wirings 211a and 211b, the Vss power wirings 213 and 215, and the connection wiring 240 may be made of aluminum (Al), which is the low resistance metal material.

In addition, in the case of the thin film transistor layer 500 formed by the oxide TFT process, the gate wirings 251a and 251b, the data wirings 253a, 253b, 255a and 255b, the Vdd power wirings 211a and 211b, the Vss power wirings 213 and 215 and the connection wiring 240 are all made of aluminum (Al) or copper (Cu), which are the low resistance metal materials.

In a case in which the connection wiring 240 is formed of the low resistance metal material, a minimum resistance requirement value may be adjusted at the time of an electrical test of the thin film transistor substrate 1a. Therefore, by adjusting a value of a test current flowing in the thin film transistor substrate 1a through the connection wiring 240, it is possible to prevent a high current flowing in the thin film transistor substrate 1a and damaging the components inside the thin film transistor substrate 1a.

The thin film transistor substrate 1a may include a plurality of driving pads 310 on the other surface of the glass substrate 250 and a plurality of link pads 320 electrically connected to the respective driving pads through a wiring 340. In this case, the wiring 340 may be covered by the insulating layer 341.

The plurality of driving pads 310, the plurality of link pads 320, the wiring 340, and the insulating layer 341 may be formed together when the thin film transistor layer 500 is formed, may be subsequently formed after forming the thin film transistor layer 500, or may be formed after removing the dummy area DA.

Hereinafter, a process of manufacturing a display module 10a using the thin film transistor substrate 1a according to another embodiment will be described sequentially with reference to FIGS. 10 and 11. Because the process of manufacturing the display module 10a is the same as the process of manufacturing the display module 10 described above, it will be described schematically.

Figure 10:
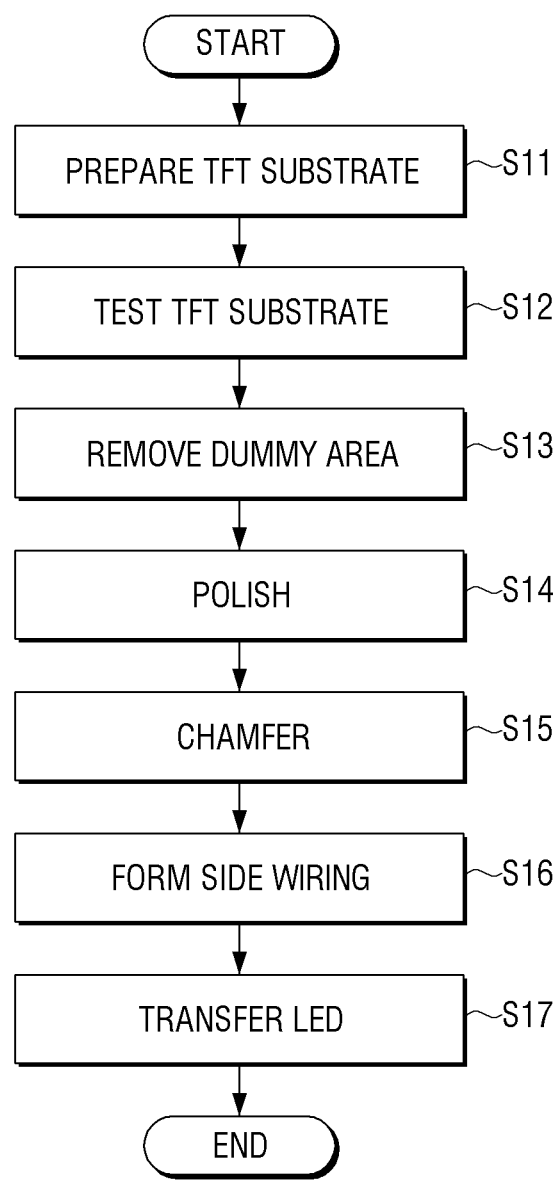
FIG. 10 is a flowchart illustrating a process of manufacturing a display module using a thin film transistor substrate according to another embodiment.

FIG. 10 is a flowchart illustrating a process of manufacturing a display module using a thin film transistor substrate according to another embodiment and FIG. 11 is a cross-sectional view illustrating a display module according to another embodiment.

First, the thin film transistor substrate 1a having the plurality of test pads 230 disposed in the dummy area DA may be prepared (S11).

Next, an electrical test of the thin film transistor substrate 1a may be performed (S12). In this case, the electrical test may be performed by contacting the test needle N (as shown in FIG. 2) to the plurality of test pads 230. By adjusting a value of a test current flowing in the thin film transistor substrate 1a through the connection wiring 240, which is a low resistance wiring, during such an electrical test, it is possible to prevent a high current flowing in the thin film transistor substrate 1a and damaging the components inside the thin film transistor substrate 1a.

When the electrical test of the thin film transistor substrate 1a is completed, the plurality of test pads 230 are no longer needed, and the dummy area DA is thus removed from the thin film transistor substrate 1a along the cutting line C (S13).

Next, a process of polishing the cutting surface of the thin film transistor substrate 1a may be performed (S14). By-products generated in the glass substrate 250 and the thin film transistor layer 500 may be removed through the polishing process.

When the polishing process is completed, corners of the cutting surface of the thin film transistor substrate 1a (in this case, the cutting surface forms a flat surface by the polishing process) are chamfered (S15). If the corner portions of the cutting surface of the thin film transistor substrate 1a are removed through the chamfering process, chamfered surfaces CF1 and CF2 may be formed as illustrated in FIG. 11.

The chamfered surfaces CF1 and CF2 of the thin film transistor substrate 1a may prevent the side wiring 280 formed on the cutting surface of the thin film transistor substrate 1a from being disconnected by the sharp-edged corners in advance.

If the chamfering process is completed, a plurality of side wirings 280 may be formed to electrically connect the plurality of connection pads 220 disposed on one surface of the glass substrate 250 and the plurality of driving pads 310 disposed on the other surface of the glass substrate 250 (S16).

Both end portions 281 and 283 of each side wiring 280 may be formed to cover at least a portion of the connection pad 220 and the driving pad 310, respectively, and a central portion 282 thereof may be formed to cover the chamfered surfaces CF1 and CF2 and the cutting surface of the glass substrate 250.

Next, the LED may be transferred or inserted so that the LED is electrically connected to the plurality of pixel electrodes 215a and 215b provided in the thin film transistor layer 500 (S17). In this case, the LED transfer may be performed through any one of a laser transfer method, a stamp transfer method, a roller transfer method, and an electrostatic transfer method.

Figure 12:
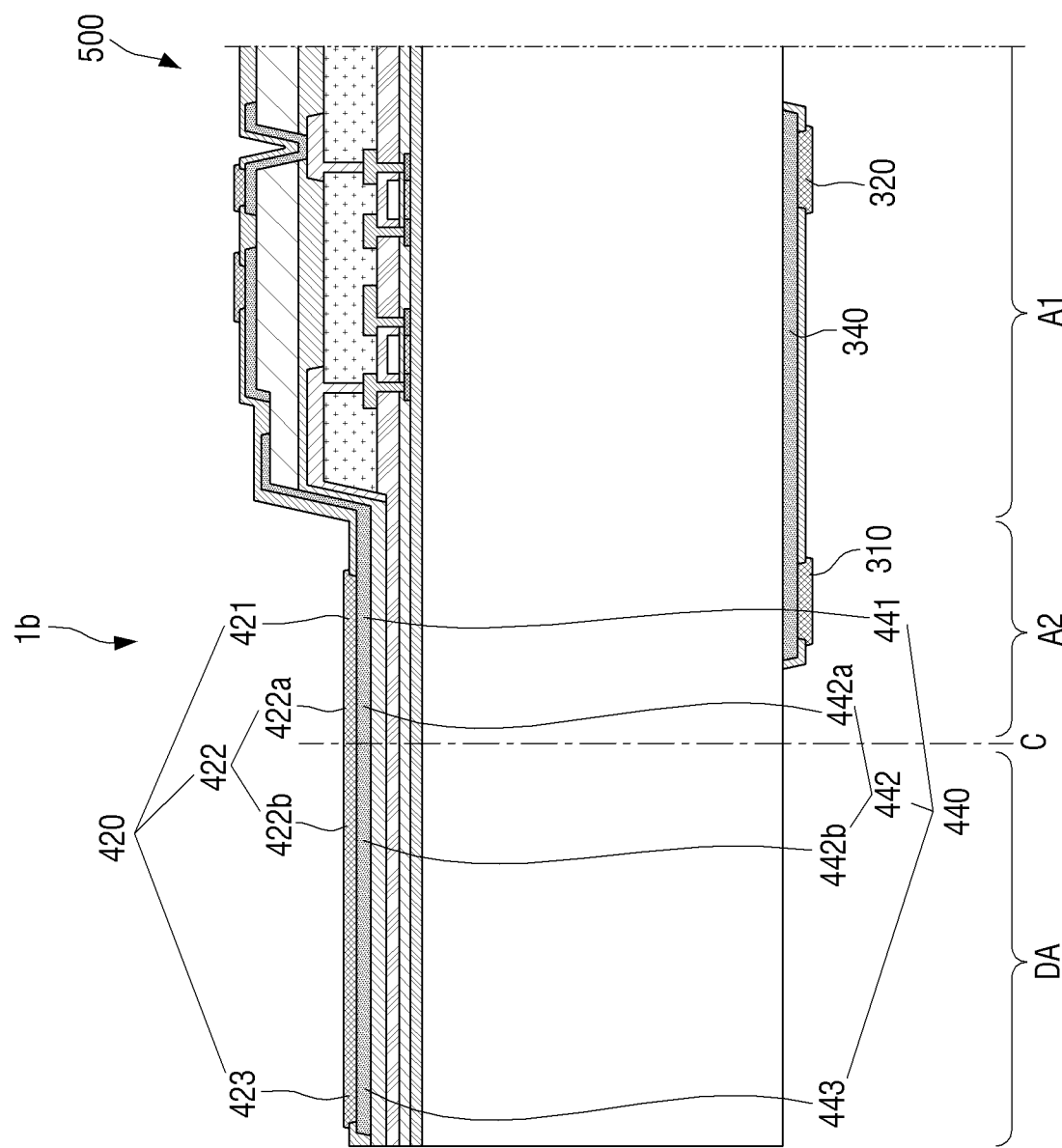
FIG. 12 is a cross-sectional view illustrating a thin film transistor substrate according to still another embodiment.
Figure 13:
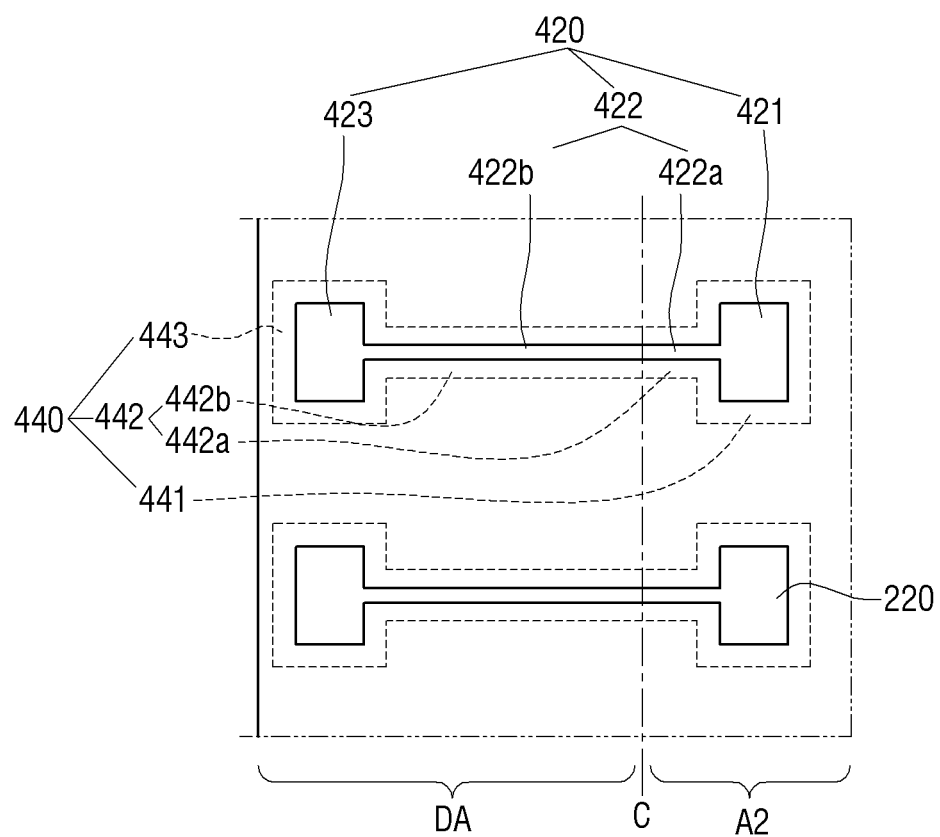
FIG. 13 is a plan view illustrating a second area A2 and a dummy area DA illustrated in FIG. 12 according to an embodiment.
Figure 14:
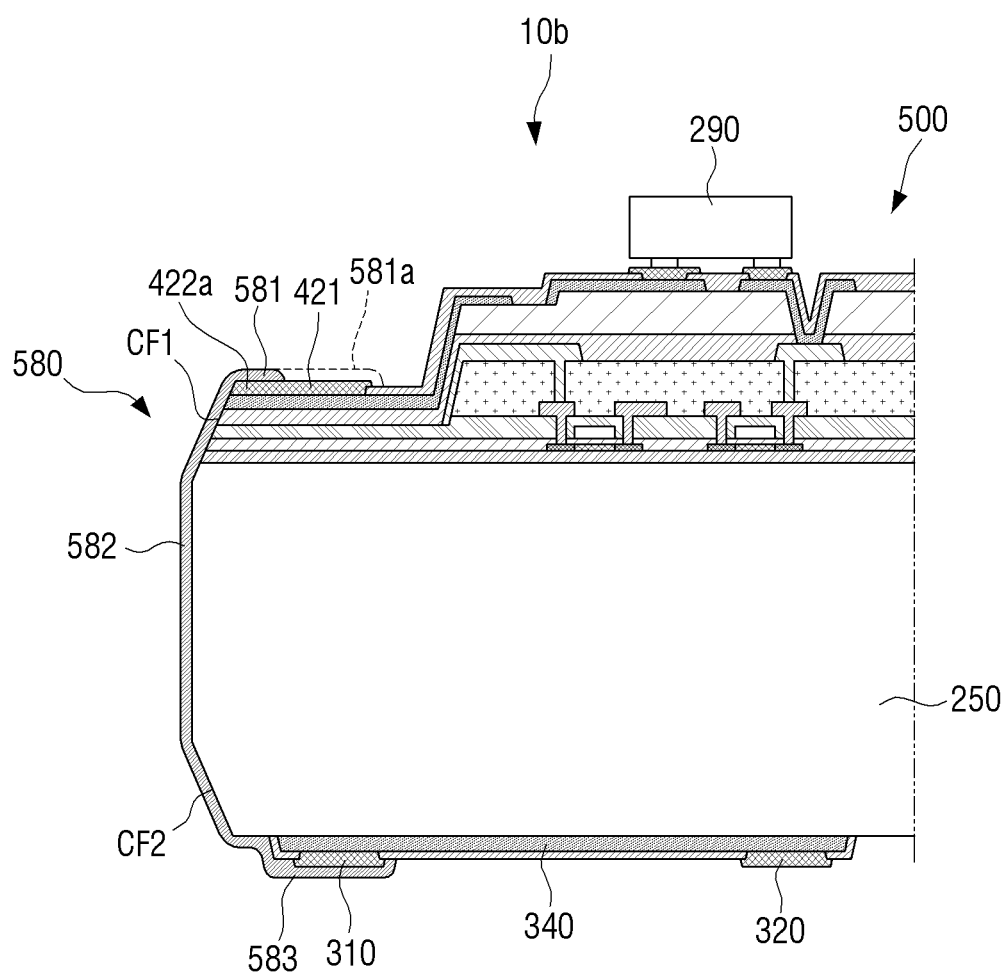
FIG. 14 is a cross-sectional view illustrating a display module according to a still another embodiment.

FIG. 12 is a cross-sectional view illustrating a thin film transistor substrate according to still another embodiment, FIG. 13 is a plan view illustrating a second area A2 and a dummy area DA illustrated in FIG. 12, and FIG. 14 is a cross-sectional view illustrating a display module according to a still another embodiment.

A thin film transistor substrate 1b according to still another embodiment may have substantially the same structure as the structure of the thin film transistor substrate 1a described above, but may differ in that the connection pad and the test pad are integrally formed. Hereinafter, the thin film transistor substrate 1b according to still another embodiment will be described, but a configuration different from that of the thin film transistor substrate 1a will be more specifically described.

Referring to FIGS. 12 and 13, an integrated pad 420 may be formed by integrally forming the connection pad 220 and the test pad 230 described above, and may have the same function of the connection pad 220 and the function of the test pad 230 described above.

The integrated pad 420 may include a connection pad part 421 electrically connected to a first connection part 441 of a connection wiring 440, a test pad part 423 electrically connected to a second connection part 443 of the connection wiring 440, and a link part 422 electrically connected along a bridge part 442 of the connection wiring 440.

A portion 422a of the link part 422 may correspond to a portion 442a of the bridge part 442, and the remaining portion 422b of the link part 422 may be disposed at a position corresponding to the remaining portion 442b of the bridge part 442.

Accordingly, when the dummy area DA is removed along the cutting line C, the portion 422a of the link part of the integrated pad 420 and the portion 442a of the bridge part 442 of the connection wiring 440 may be exposed at the cutting surface of the glass substrate 250.

Referring to FIG. 14, the thin film transistor substrate 10b in the state in which the dummy area DA is removed may have the portion 422a of the link part of the integrated pad disposed up to the chamfered surface CF1. Accordingly, one end portion 581 of a side wiring 580 may be formed to cover only the portion 422a of the link part of the integrated pad.

However, one end portion 581 of a side wiring 580 is not limited thereto and may also be formed to cover the portion 422a of the link part of the integrated pad and the connection pad part 421.

In addition, the other end portion 583 of the side wiring 580 may be formed to cover at least a portion of the driving pad 310, and a central portion 582 thereof may be formed to cover the respective chamfered surfaces CF1 and CF2 and the cutting surface of the glass substrate 250.

Although various embodiments have been individually described hereinabove, the respective embodiments are not necessarily implemented individually, but may also be implemented so that configurations and operations thereof are combined with those of one or more other embodiments.

Although the embodiments of the disclosure have been illustrated and described hereinabove, the disclosure is not limited to the specific embodiments described above, but may be variously modified by those skilled in the art to which the disclosure pertains without departing from the scope and spirit of the disclosure. Such modifications should not be individually understood from the technical spirit or the prospect of the disclosure.

What is claimed is:

1. A display module comprising:
    a glass substrate;
    a thin film transistor layer disposed on a first area of the glass substrate;
    a plurality of connection pads disposed in a second area of the glass substrate extending from the first area of the glass substrate and electrically connected to the thin film transistor layer;
    a plurality of test pads disposed in a third area of the glass substrate extending from the second area of the glass substrate and electrically connected to the plurality of connection pads, respectively; and
    a plurality of connection wirings electrically connecting the plurality of connection pads and the plurality of test pads.

2. The display module as claimed in claim 1, wherein the plurality of connection wirings are disposed in the second and third areas of the glass substrate,
    wherein the plurality of connection wirings comprise at least one of molybdenum (Mo), titanium (Ti) and TiMo, and
    wherein insulating layers are disposed on upper and lower portions of the plurality of connection wirings, respectively.

3. The display module as claimed in claim 1, wherein the plurality of test pads are removed after a substrate test is performed, and
    wherein the plurality of test pads are disposed in zigzag along the third area.

4. The display module as claimed in claim 3, wherein an area of each of the plurality of test pads is greater than an area of each of the plurality of connection pads.

5. The display module as claimed in claim 1, wherein the plurality of test pads are formed integrally with the plurality of connection pads corresponding to each other.

6. The display module as claimed in claim 1, further comprising a plurality of low resistance wirings disposed between each of the plurality of test pads and each of the plurality of connection wirings.

7. The display module as claimed in claim 1, wherein the glass substrate has a quadrangular shape, and
    the third area of the glass substrate comprising two adjacent side surface portions of the glass substrate.

8. The display module as claimed in claim 1, wherein the plurality of connection wirings comprise a plurality of sub-connection wirings spaced apart from each other at a predetermined interval.

9. A display module comprising:
    a glass substrate;
    a thin film transistor layer formed on a first surface of the glass substrate;
    a plurality of light emitting diodes (LEDs) mounted on the thin film transistor layer;
    a plurality of connection pads formed on the first surface of the glass substrate;
    a plurality of driving pads formed on a second surface of the glass substrate;
    a plurality of side wirings configured to electrically connect the plurality of connection pads and the plurality of driving pads corresponding to each of the plurality of connection pads; and
    a plurality of connection wirings configured to connect a plurality of connection pads and a plurality of test pads in a dummy area extending to an edge area of the glass substrate,
    wherein the plurality of test pads and a portion of each of the plurality of connection wirings corresponding to the plurality of test pads are removed after a substrate test is performed.

10. The display module as claimed in claim 9, wherein the plurality of connection wirings are electrically connected to the plurality of side wirings.

11. The display module as claimed in claim 9, wherein each of the plurality of connection wirings is covered with a first insulating layer on one surface and a second insulating layer on the other surface.

12. The display module as claimed in claim 9, wherein the plurality of connection pads are formed integrally with the plurality of removed test pads, and
    wherein one surface of each of the plurality of connection wirings is connected to the plurality of connection pads.

13. The display module as claimed in claim 9, wherein each of the plurality of connection wirings comprises a plurality of sub-connection wirings spaced apart from each other at a predetermined interval.

* * * * *